(12) United States Patent
Cho et al.

(10) Patent No.: US 9,041,175 B2
(45) Date of Patent: May 26, 2015

(54) MONOLITHIC POWER CONVERTER PACKAGE

(71) Applicant: International Rectifier Corporation, El Segundo, CA (US)

(72) Inventors: Eung San Cho, Torrance, CA (US); Dean Fernando, Torrance, CA (US); Tim Philips, Hope, RI (US); Dan Clavette, Greene, RI (US)

(73) Assignee: International Rectifier Corporation, El Segundo, CA (US)

( * ) Notice: Subject to any disclaimer, the term of this patent is extended or adjusted under 35 U.S.C. 154(b) by 399 days.

(21) Appl. No.: 13/656,341

(22) Filed: Oct. 19, 2012

(65) Prior Publication Data
US 2013/0257524 A1 Oct. 3, 2013

Related U.S. Application Data

(60) Provisional application No. 61/619,330, filed on Apr. 2, 2012.

(51) Int. Cl.
*H01L 23/06* (2006.01)
*H01L 23/48* (2006.01)
*H01L 23/00* (2006.01)

(52) U.S. Cl.
CPC ............... *H01L 24/37* (2013.01); *H01L 24/41* (2013.01); *H01L 24/92* (2013.01); *H01L 2224/37032* (2013.01); *H01L 2224/37124* (2013.01); *H01L 2224/37147* (2013.01); *H01L 2224/38* (2013.01); *H01L 2224/40227* (2013.01); *H01L 2224/45099* (2013.01); *H01L 2224/48091* (2013.01); *H01L 2224/48227* (2013.01); *H01L 2224/49171* (2013.01); *H01L 2224/73221* (2013.01); *H01L 2224/84205* (2013.01); *H01L 2224/84801* (2013.01); *H01L 2224/92246* (2013.01); *H01L 2924/00* (2013.01); *H01L 2924/00014* (2013.01); *H01L 2924/1305* (2013.01); *H01L 2924/13055* (2013.01); *H01L 2924/1306* (2013.01); *H01L 2924/13064* (2013.01); *H01L 2924/13091* (2013.01); *H01L 2924/30107* (2013.01)

(58) Field of Classification Search
USPC .................. 257/684, 698, 723, 724, 774, 784
See application file for complete search history.

(56) References Cited

U.S. PATENT DOCUMENTS

| | | | | |
|---|---|---|---|---|
| 6,031,279 | A * | 2/2000 | Lenz | 257/686 |
| 6,278,264 | B1 | 8/2001 | Burstein | |
| 6,462,264 | B1 | 10/2002 | Elam | |
| 6,462,522 | B2 | 10/2002 | Burstein | |
| 7,800,217 | B2 * | 9/2010 | Otremba et al. | 257/700 |
| 8,120,158 | B2 * | 2/2012 | Ewe et al. | 257/686 |

* cited by examiner

*Primary Examiner* — Hung Vu
(74) *Attorney, Agent, or Firm* — Farjami & Farjami LLP

(57) ABSTRACT

According to an exemplary embodiment, a monolithic power converter package includes a monolithic die over a substrate, the monolithic die integrating a driver integrated circuit (IC) with a control power transistor and a sync power transistor connected in a half-bridge. A high side power input, a low side power input, and a power output of the half-bridge are each disposed on a top surface of the monolithic die. The high side power input is electrically and mechanically coupled to the substrate by a high side power strip. Also, the low side power input is electrically and mechanically coupled to the substrate by a low side power strip. Furthermore, the power output is electrically and mechanically coupled to the substrate by a power output strip.

20 Claims, 4 Drawing Sheets

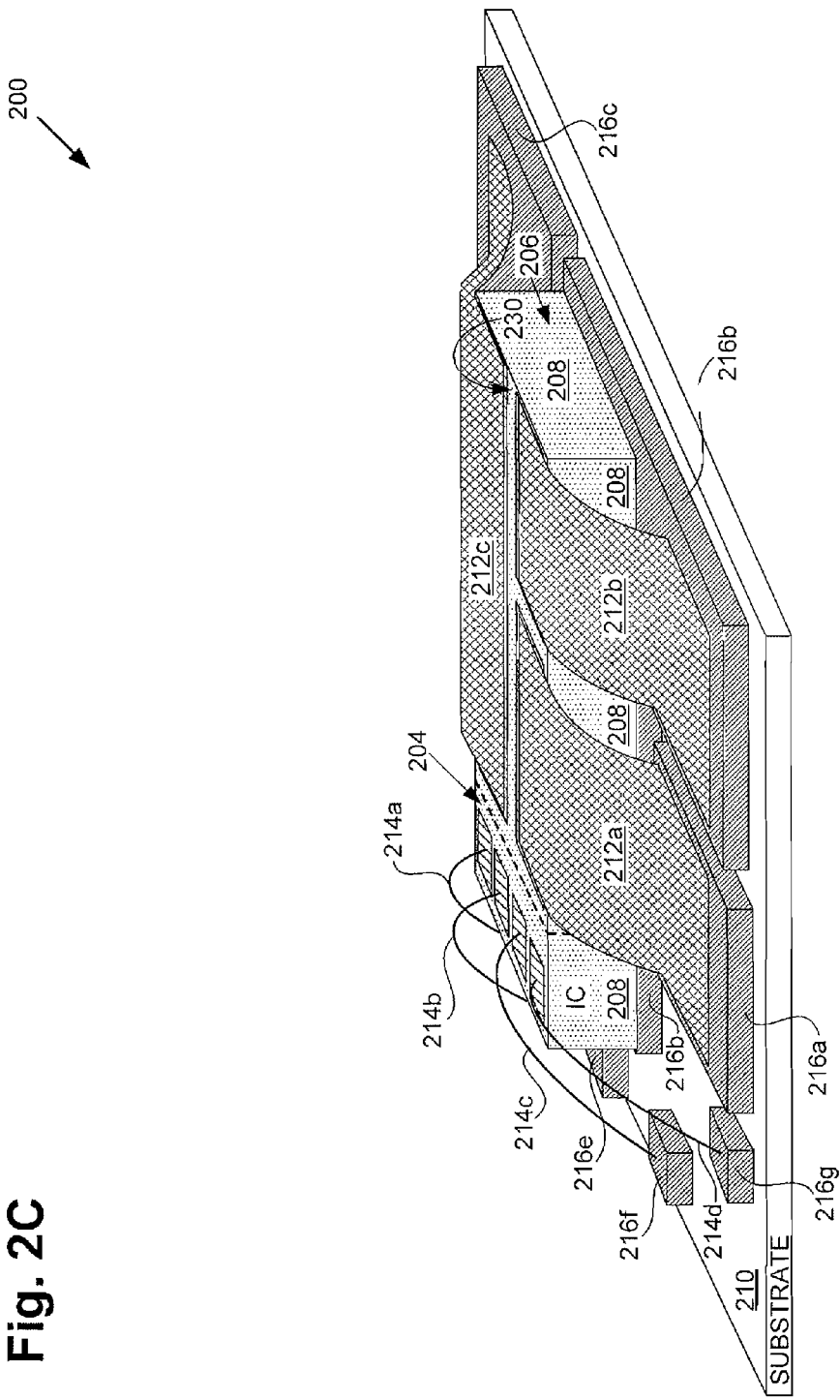

MONOLITHIC POWER CONVERTER PACKAGE

The present application claims the benefit of and priority to a provisional application entitled "Monolithic Power Converter Package," Ser. No. 61/619,330 filed on Apr. 2, 2012. The disclosure in this provisional application is hereby incorporated fully by reference into the present application.

BACKGROUND OF THE INVENTION

1. Field of the Invention

The present invention is generally in the field of semiconductors. More particularly, the invention relates to the packaging of semiconductor dies.

2. Background Art

Switch-mode power converters, such as synchronous power converters, are well known. A synchronous power converter may typically include a control power transistor and a synchronous (sync) power transistor connected in a half-bridge and a driver integrated circuit (IC) for driving the control and sync power transistors. It is desirable to form a synchronous power converter in which a control power transistor, a sync power transistor, and a driver IC are monolithically formed on a common die (i.e. a monolithic die). Among other advantages, such a monolithic die would allow for packaging that is smaller and easier to assemble than a synchronous power converter having more than one die.

The monolithic die can have a high side power input, a low side power input, and a power output of the half-bridge. One approach to assembling the monolithic die in a package would be to connect to the high side power input, the low side power input, and the power output using bond wires. However, in order to achieve low resistive and inductive connections for the monolithic die, many bond wires must be attached to the monolithic die. As such, assembling the monolithic die in the package would become complex and costly. Furthermore, bond wires can be prone to lift-off due to, for example, mechanical stress that can cause the bond wires to fail. Additionally, bond wires can interfere with placement of a heat sink to dissipate heat from the monolithic die.

It would be desirable to provide for a monolithic die in a power converter package that can achieve low resistive and inductive connections for the monolithic die, without use of bond wires for connection to a high side power input, low side power input, and power output of the monolithic die.

SUMMARY OF THE INVENTION

A monolithic power converter package, substantially as shown in and/or described in connection with at least one of the figures, and as set forth more completely in the claims.

BRIEF DESCRIPTION OF THE DRAWINGS

FIG. 2C illustrates a perspective view of a monolithic power converter package, according to one embodiment of the present invention.

DETAILED DESCRIPTION OF THE INVENTION

The present invention is directed to a monolithic power converter package. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
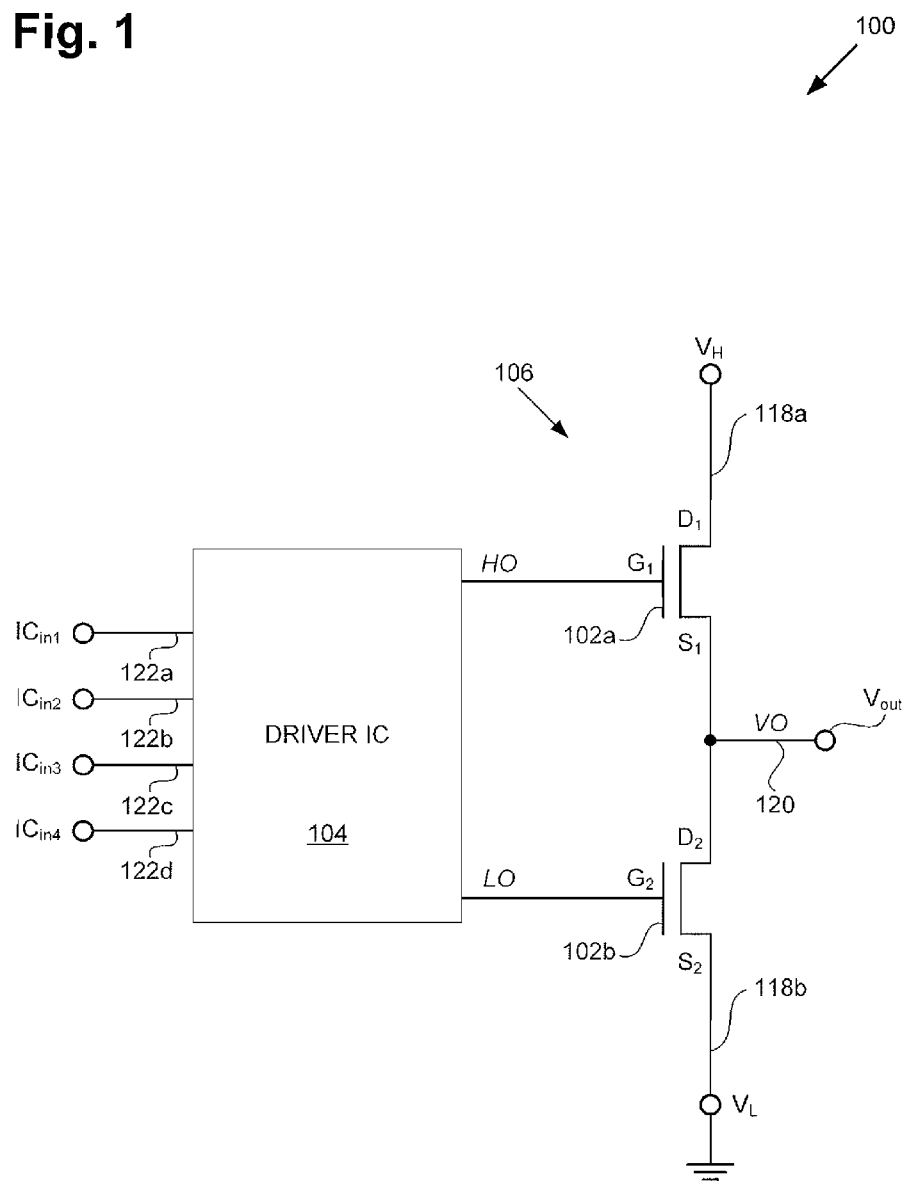
FIG. 1 shows an exemplary circuit schematic of a monolithic power converter package, according to one embodiment of the invention.

FIG. 1 shows an exemplary schematic of monolithic power converter package circuit 100 (also referred to as "power converter circuit"), according to one embodiment of the invention. In the present embodiment, power converter circuit 100 includes half-bridge 106 comprising high side power transistor 102a (also referred to as "control power transistor") and low side power transistor 102b (also referred to as "synchronous (sync) power transistor"). Also in the present embodiment, power converter circuit 100 includes high side power input terminal $V_H$, low side power input terminal $V_L$, IC input terminals $IC_{in1}$, $IC_{in2}$, $IC_{in3}$, and $IC_{in4}$, and power output terminal $V_{out}$.

Half-bridge 106 includes high side power input 118a, low side power input 118b, and power output 120. High side power input 118a is coupled to high side power input terminal $V_H$, low side power input 118b is coupled to low side power input terminal $V_L$, and power output terminal 120 is coupled to power output terminal $V_{out}$. In the present embodiment, low side power input 118b is a ground input for half-bridge 106 while high side power input 118b is a high voltage input.

Control power transistor 102a and sync power transistor 102b of half-bridge 106 can be respective control and sync power transistors of a switched-mode power converter, such as a synchronous power converter (e.g., a synchronous buck converter). Control power transistor 102a and sync power transistor 102b can generally be any transistor, such as a field-effect transistors (FET). Non-limiting examples of control power transistor 102a and sync power transistor 102b include a metal-oxide-semiconductor field-effect transistor (MOSFET), a high electron mobility transistor (HEMT), an insulated gate bipolar transistor (IGBT), and the like.

As shown in FIG. 1, control power transistor 102a has source $S_1$, drain $D_1$, and gate $G_1$ whereas sync power transistor 102b has source $S_2$, drain $D_2$, and gate $G_2$. Control power transistor 102a is coupled between high side power input terminal $V_H$ and power output terminal $V_{out}$. Sync power transistor 102b is coupled between power output terminal $V_{out}$ and low side power terminal $V_L$. High side power input terminal $V_H$ is for receiving a high side power input and low side power input terminal $V_L$ is for receiving a low side power input, such as ground.

Monolithic power converter package circuit 100 can include additional components that are not specifically shown in FIG. 1. For example, in some embodiments control power transistor 102a can have a diode coupled to source $S_1$ and drain $D_1$. In one embodiment, for example, a freewheeling diode is antiparallel with control power transistor 102a. Similarly, sync power transistor 102b can have a diode coupled to source $S_2$ and drain $D_2$, which can be a freewheeling diode that is antiparallel with sync power transistor 102b.

Half bridge 106 is coupled to driver integrated circuit (IC) 104, which is for driving control power transistor 102a and sync power transistor 102b to generate power output signal VO for power output terminal $V_{out}$. In the present embodiment driver IC 104 has four IC inputs 122a, 122b, 122c, and 122d coupled respectively to IC input terminals $IC_{in1}$, $IC_{in2}$, $IC_{in3}$, and $IC_{in4}$. In various embodiments of the present invention, IC inputs terminals $IC_{in1}$, $IC_{in2}$, $IC_{in3}$, and $IC_{in4}$ can receive any suitable inputs for a driver IC. Examples include a feedback signal, such as a signal generated from power output 120, a power input for powering driver IC 104, and a gate control signal for control power transistor 102a and/or sync power transistor 102b. While the present embodiment includes four IC input terminals $IC_{in1}$, $IC_{in2}$, $IC_{in3}$, and $IC_{in4}$ and four IC inputs 122a, 122b, 122c, and 122d, other embodiments have more or fewer IC input terminals and IC inputs.

Also in the present embodiment, driver IC 104 provides high side signal HO to gate $G_1$ of control power transistor 102a to drive control power transistor 102a and provides low side signal LO to gate $G_2$ of sync power transistor 102b to drive sync power transistor 102b. More particularly, high side signal HO and low side signal LO can be utilized to selectively enable and disable control power transistor 102a and sync power transistor 102b.

Figure 2A:
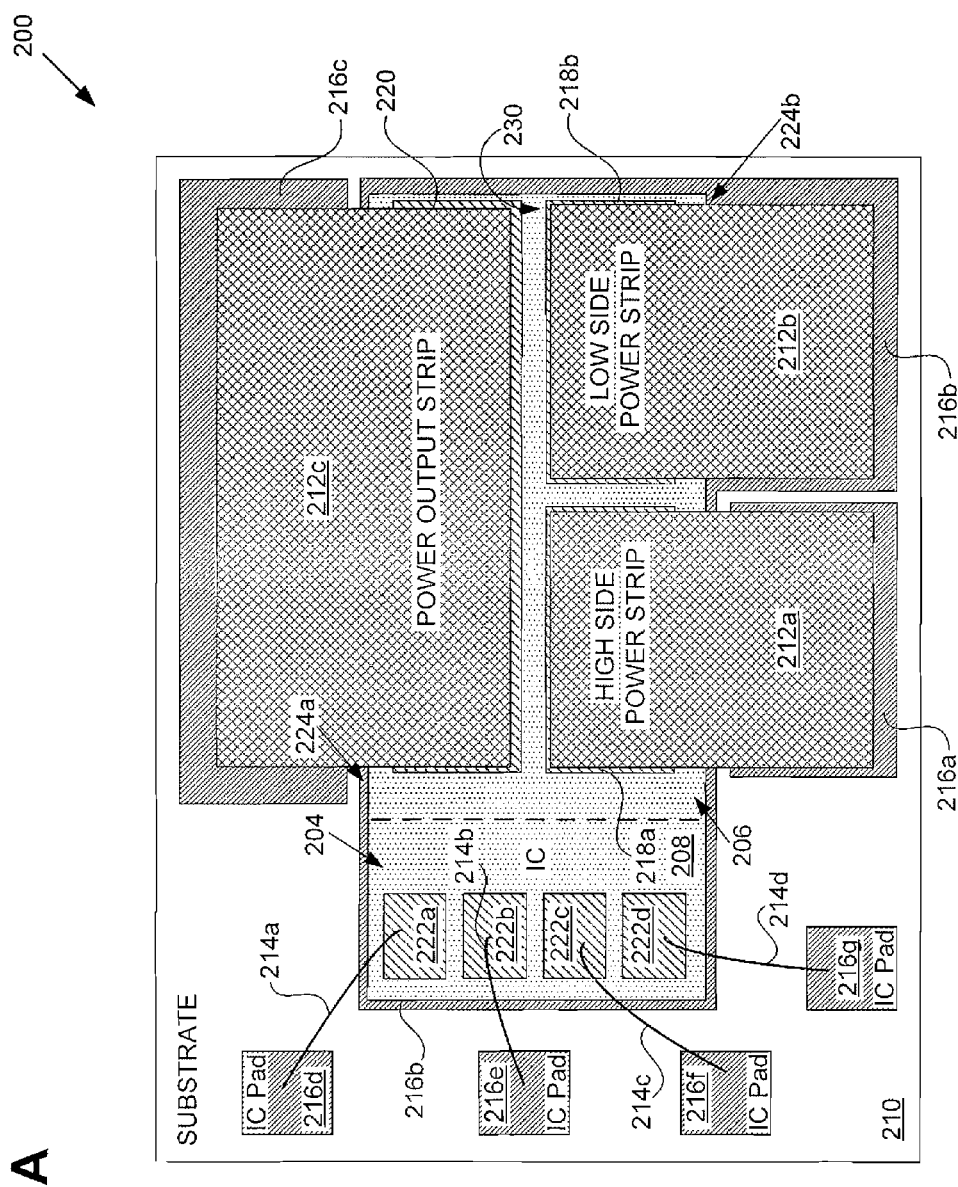
FIG. 2A illustrates a top view of a monolithic power converter package, according to one embodiment of the present invention.
Figure 2B:
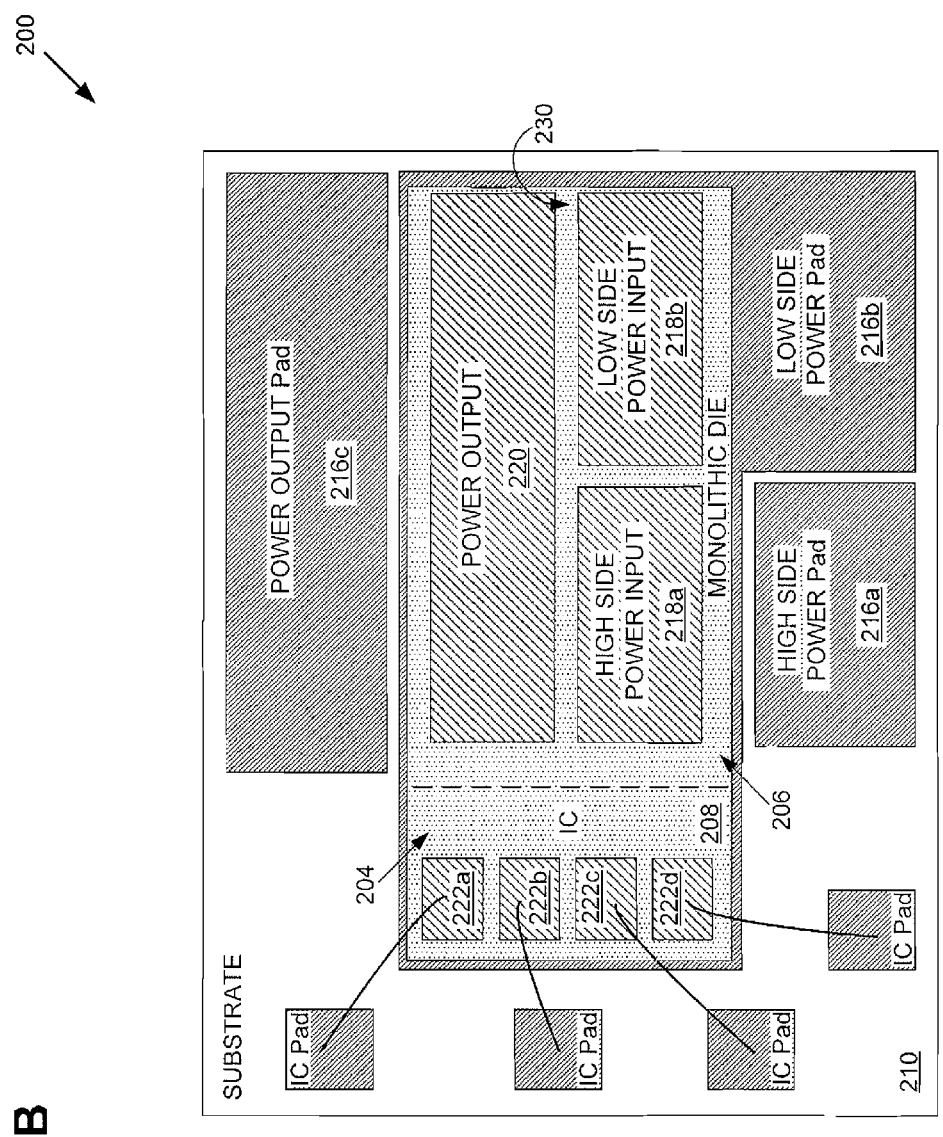
FIG. 2B illustrates a selective top view of a monolithic power converter package, according to one embodiment of the present invention.

Referring now to FIGS. 2A-2C, FIGS. 2A-2C illustrate different views of monolithic power converter package 200 (also referred to as "power converter package"), according to one embodiment of the present invention. FIG. 2A illustrates a top view of power converter package 200, FIG. 2B illustrates a selective top view of power converter package 200, and FIG. 2C illustrates a perspective view of power converter package 200. Monolithic power converter package 200 in FIGS. 2A-2C corresponds to monolithic power converter package circuit 100 in FIG. 1.

In the present embodiment, monolithic power converter package 200 is a synchronous buck converter package comprising monolithic die 208, substrate 210, high side power strip 212a, low side power strip 212b, power output strip 212c, and bond wires 214a, 214b, 214c, and 214d.

In monolithic power converter package 200, substrate 210 comprises any suitable substrate. Examples of substrate 210 include a ceramic substrate, a printed circuit board (PCB) substrate, a laminate substrate, a direct bonded copper (DBC) substrate, and a leadframe. In the present embodiment, substrate 210 includes high side power pad 216a, low side power pad 216b, power output pad 216c, and IC pads 216d, 216e, 216f, and 216g, which comprise conductive material, such as copper. Also in the present embodiment, high side power pad 216a, low side power pad 216b, power output pad 216c, and IC pads 216d, 216e, 216f, and 216g correspond respectively to high side power input terminal $V_H$, low side power input terminal $V_L$, power output terminal $V_{out}$, and IC input terminals $IC_{in1}$, $IC_{in2}$, $IC_{in3}$, and $IC_{in4}$ in FIG. 1.

As shown in FIGS. 2A-2C, monolithic die 208 is over substrate 210. More particularly, monolithic die 208 is over low side power pad 216b of substrate 210. Monolithic die 208, comprises driver IC 204, corresponding to driver IC 104 in FIG. 1 and half-bridge 206, corresponding to half-bridge 106 in FIG. 1. Thus, monolithic die 208 is integrating driver IC 204 with a control power transistor, corresponding control power transistor 102a in FIG. 1, and a sync power transistor, corresponding to sync power transistor 102b in FIG. 1, where the control power transistor and the sync power transistor are connected in half-bridge 206. In FIGS. 2A-2C, a dashed line indicates a separation between driver IC 204 and half-bridge 206.

Monolithic die 208 further comprises high side power input 218a, low side power input 218b, power output 220, and IC inputs 222a, 222b, 222c, and 222d, which correspond respectively to high side power input 118a, low side power input 118b, power output 120, and IC inputs 122a, 122b, 122c, and 122d in FIG. 1. FIG. 2B illustrates a selective top view of monolithic power converter package 200 that does not show high side power strip 212a, low side power strip 212b, and power output strip 212c in order more clearly show high side power input 218a, low side power input 218b, and power output 220 of half-bridge 206 each being disposed on top surface 230 of monolithic die 208. FIGS. 2A-2C further show that IC inputs 222a, 222b, 222c, and 222d (also referred to as "plurality of IC inputs 222a-222d") of driver IC 204 are also each disposed on top surface 230 of monolithic die 208.

In the present embodiment, plurality of IC inputs 222a-222d are each electrically and mechanically coupled to said substrate 210. IC input 222a is electrically and mechanically coupled to substrate 210 by bond wire 214a. For example, in the present embodiment, bond wire 214a electrically and mechanically couples IC input 222a to IC pad 216d of substrate 210. Furthermore, IC input 222b is electrically and mechanically coupled to substrate 210 by bond wire 214b. For example, in the present embodiment, bond wire 214b electrically and mechanically couples IC input 222b to IC pad 216e of substrate 210. Additionally, IC input 222c is electrically and mechanically coupled to substrate 210 by bond wire 214c. For example, in the present embodiment, bond wire 214c electrically and mechanically couples IC input 222c to IC pad 216f of substrate 210. Similarly, IC input 222d is electrically and mechanically coupled to substrate 210 by bond wire 214d. For example, in the present embodiment, bond wire 214d electrically and mechanically couples IC input 222d to IC pad 216g of substrate 210.

One approach to assembling monolithic die 208 in power converter package 200 would be to connect to high side power input 218a, low side power input 218b, and power output 220 using bond wires. However, in order to achieve low resistive and inductive connections for monolithic die 208, many bond wires must be attached to monolithic die 208. As such, assembling monolithic die 208 in monolithic power converter package 200 would become complex and costly. Furthermore, bond wires can be prone to lift-off due to, for example, mechanical stress that can cause the bond wires to fail. Additionally, bond wires would interfere with placement of a heat sink over monolithic die 208 to dissipate heat from monolithic die 208.

In accordance with embodiments of the present invention, high side power input 218a is electrically and mechanically coupled to substrate 210 by high side power strip 212a. For example, in the present embodiment, high side power strip 212a electrically and mechanically couples high side power input 218a to high side power pad 216a of substrate 210. Furthermore, low side power input 218b is electrically and mechanically coupled to low side power pad 216b of substrate 210 by low side power strip 212b. For example, in the present embodiment, low side power strip 212b electrically and mechanically couples low side power input 218b to low side power pad 216b of substrate 210. Additionally, power output 220 is electrically and mechanically coupled to power output pad 216c of substrate 210 by power output strip 212c. For example, in the present embodiment, power output strip 212c electrically and mechanically couples power output 220 to power output pad 216c of substrate 210. Monolithic power converter package 200 thereby achieves low resistive and inductive connections for monolithic die 208, without using a bond wire for connection to high side power input 218a, low side power input 218b, and power output 220.

FIGS. 2A and 2C show that power output strip 212c overhangs side 224a of monolithic die 208 and high side power strip 212a overhangs side 224b of monolithic die 208, which is opposite to side 224a. FIGS. 2A and 2C further show that low side power strip 212b overhangs side 224h of monolithic die 208 and is adjacent high side power strip 212a. Using such an arrangement, allows for power output strip 212c to be larger than both high side power strip 212a and low side power strip 212b (both individually and combined) with higher current carrying capability. In the present embodiment, high side power strip 212a and low side power strip 212b are of approximately a same size.

In some embodiments, at least one of high side power strip 212a, low side power strip 212b, and power output strip 212c comprises, for example, a conductive clip, such as a copper clip. Thus, in some embodiments, high side power strip 212a comprises a high side power clip, low side power strip 212b comprises a low side power clip, and power output strip 212c comprises a power output clip. In embodiments where at least one of high side power strip 212a, low side power strip 212b, and power output strip 212c comprises a conductive clip, the conductive clip can be, for example, soldered to at least one of high side power input 218a, low side power input 218b, and power output 220, as well as be soldered to a corresponding one of high side power pad 216a, low side power pad 216b, and power output pad 216c. Furthermore, in such embodiments, at least one of high side power input 218a, low side power input 218b, and power output 220 can comprise a solderable front metal (SFM).

Also, in some embodiments, at least one of high side power strip 212a, low side power strip 212b, and power output strip 212c comprises, for example, a conductive ribbon. Thus, in some embodiments, high side power strip 212a comprises a high side power ribbon, low side power strip 212b comprises a low side power ribbon, and power output strip 212c comprises a power output ribbon. The conductive ribbon can be, as examples, an aluminum ribbon, a copper ribbon, and an aluminum or copper clad ribbon. In embodiments where at least one of high side power strip 212a, low side power strip 212b, and power output strip 212c comprises a conductive ribbon, the conductive ribbon can be, for example, mechanically bonded to at least one of high side power input 218a, low side power input 218b, and power output 220, as well as being mechanically bonded to a corresponding one of high side power pad 216a, low side power pad 216b, and power output pad 216c. The mechanical bonding can be facilitated by, for example, ultrasonic vibrations.

In accordance with embodiments of the present invention, high side power strip 212a, low side power strip 212b, and power output strip 212c can be any combination of a conductive clip, a conductive ribbon, and another power strip not specifically described herein. Furthermore, monolithic power converter package 200 can comprise more than one of high side power strip 212a, low side power strip 212b, and power output strip 212c.

High side power strip 212a, low side power strip 212b, and power output strip 212e each have lower resistivity and inductance than a bond wire. As such, less high side power strips 212a, low side power strips 212b, and power output strips 212c are required as compared to bond wires to achieve low resistive and inductive connections for monolithic die 208. For example, the embodiment shown in FIGS. 2A-2C includes only one high side power strip 212a, only one low side power strip 212b, and only one power output strip 212c. As such, assembling monolithic die 208 in monolithic power converter package 200 is not complex and costly. Furthermore, high side power strip 212a, low side power strip 212b, and power output strip 212c are less prone to failure than bond wires. Additionally, high side power strip 212a, low side power strip 212b, and power output strip 212c could accommodate a heat sink over monolithic die 208 to dissipate heat from monolithic die 208.

Thus, as discussed above with respect to FIGS. 1, 2A, 2B, and 2C, embodiments of the present invention can provide for a monolithic die in a power converter package that can achieve low resistive and inductive connections for the monolithic die, without use of bond wires for connection to a high side power input, low side power input, and power output of the monolithic die.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A monolithic power converter package comprising:
    a monolithic die over a substrate, said monolithic die integrating a driver integrated circuit (IC) with a control power transistor and a sync power transistor connected in a half-bridge;
    a high side power input, a low side power input, and a power output of said half-bridge each being disposed on a top surface of said monolithic die;
    said high side power input being electrically and mechanically coupled to said substrate by a high side power strip;
    said low side power input being electrically and mechanically coupled to said substrate by a low side power strip;
    said power output being electrically and mechanically coupled to said substrate by a power output strip;
    said monolithic power converter package thereby achieving low resistive and inductive connections for said monolithic die, without using a bond wire for connection to said high side power input, said low side power input, and said power output.

2. The monolithic power converter package of claim 1, wherein said power output strip electrically and mechanically couples said power output to a power output pad of said substrate.

3. The monolithic power converter package of claim 1, wherein said high side power strip electrically and mechanically couples said high side power input to a high side power pad of said substrate.

4. The monolithic power converter package of claim 1, wherein said low side power strip electrically and mechanically couples said low side power input to a low side power pad of said substrate.

5. The monolithic power converter package of claim 1, wherein said low side power strip electrically and mechanically couples said low side power input to a low side power pad of said substrate, said monolithic die being over said low side power pad.

6. The monolithic power converter package of claim 1, wherein said power output strip overhangs one side of said monolithic die and said high side power strip overhangs another side of said monolithic die.

7. The monolithic power converter package of claim 6, wherein said low side power strip overhangs another side of said monolithic die.

8. The monolithic power converter package of claim 1, wherein said low side power input is a ground input for said half-bridge.

9. The monolithic power converter package of claim 1, wherein said high side power input is electrically and mechanically coupled to said substrate by only one high side power strip.

10. The monolithic power converter package of claim 1, wherein said low side power input is electrically and mechanically coupled to said substrate by only one low side power strip.

11. The monolithic power converter package of claim 1, wherein said power output is electrically and mechanically coupled to said substrate by only one power output strip.

12. The monolithic power converter package of claim 1, wherein said high side power strip is a high side power ribbon.

13. The monolithic power converter package of claim 1, wherein said low side power strip is a low side power ribbon.

14. The monolithic power converter package of claim 1, wherein said power output strip is a power output ribbon.

15. The monolithic power converter package of claim 1, wherein said high side power strip is a high side power clip.

16. The monolithic power converter package of claim 1, wherein said low side power strip is a low side power clip.

17. The monolithic power converter package of claim 1, wherein said power output strip is a power output clip.

18. The monolithic power converter package of claim 1, wherein said monolithic power converter package is a synchronous buck converter package.

19. The monolithic power converter package of claim 1, further comprising a plurality of IC inputs disposed on said top surface of said monolithic die.

20. The monolithic power converter package of claim 1, further comprising a plurality of IC inputs disposed on said top surface of said monolithic die, said plurality of IC inputs each being electrically and mechanically coupled to said substrate.

* * * * *